(12) United States Patent
Ross

(10) Patent No.: US 6,466,070 B1
(45) Date of Patent: Oct. 15, 2002

(54) LOW VOLTAGE CHARGE PUMP

(75) Inventor: James P. Ross, Lakeville, MN (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/745,355

(22) Filed: Dec. 21, 2000

(51) Int. Cl.[7] .............................................. H03L 7/06
(52) U.S. Cl. ...................... 327/157; 327/536; 327/537; 323/312; 323/315; 363/59; 363/60
(58) Field of Search ................................ 327/156, 157, 327/536, 537; 363/59, 60; 307/110; 323/312, 315, 316; 331/17, 25

(56) References Cited

U.S. PATENT DOCUMENTS

| | | | |
|---|---|---|---|
| 5,422,529 A | * | 6/1995 | Lee ............................. 327/536 |
| 5,619,161 A | | 4/1997 | Novof et al. |
| 5,625,306 A | * | 4/1997 | Tada ............................ 327/112 |
| 5,699,020 A | * | 12/1997 | Jefferson ..................... 327/157 |
| 5,736,880 A | | 4/1998 | Bruccoleri et al. |
| 5,736,892 A | | 4/1998 | Lee |
| 5,740,213 A | | 4/1998 | Dreyer |
| 5,831,484 A | | 11/1998 | Lukes et al. |
| 5,889,437 A | * | 3/1999 | Lee ............................. 327/157 |
| 6,011,822 A | | 1/2000 | Dreyer |
| 6,198,320 B1 | * | 3/2001 | Boerstler ..................... 327/157 |

OTHER PUBLICATIONS

Behzad Razavi, "Monolithic Phase–Locked Loops and Clock Recovery Circuits–Theory and Design,"1996, pp. 28–29.

* cited by examiner

*Primary Examiner*—Kenneth B. Wells
*Assistant Examiner*—An T. Luu
(74) *Attorney, Agent, or Firm*—Fogg, Slifer & Folglaze

(57) ABSTRACT

A charge pump circuit that can be used in a phase-locked loop circuit provides a differential output signal that has a common mode voltage. The charge pump includes a common mode feedback circuit that maintains a predetermined common mode voltage on output connection of the charge pump. The charge pump can operate with a small supply voltage. In one embodiment, the charge pump can operate with a supply voltage that is less than 2.0 volts and maintain a common mode voltage that is less than 1.0 volts. The common mode feedback circuit includes current mirror circuitry and bias circuitry. The current mirror circuitry and the bias circuitry adjust the common mode voltage in response to input signals.

7 Claims, 4 Drawing Sheets

LOW VOLTAGE CHARGE PUMP

TECHNICAL FIELD OF THE INVENTION

The present invention relates generally to charge pump circuits and in particular the present invention relates to an improved low voltage charge pump circuit.

BACKGROUND OF THE INVENTION

Phase lock loop circuits (PLL) are used to generate an output signal that has the same phase as a reference, or input, signal. The PLL typically includes a phase/frequency detector, a charge pump, loop filter and a controlled oscillator. The charge pump provides output signal(s) that control the oscillator.

One embodiment of a differential charge pump that can be used in a PLL is illustrated in FIG. 1. This charge pump includes differential n-channel transistor pairs M1 and M2, and M3 and M4. Each differential transistor pair has gates coupled to receive differential input voltage. For example, M1 and M2 receive a first differential phase voltages (UP and /UP) and transistors M3 and M4 receive a second differential phase voltage (DOWN and /DOWN). The differential pairs steer current to the output nodes. The output current is determined by Ip and the voltage present at the inputs (Up, /UP, /DOWN, /DOWN). The input signals of the differential circuit control only pull-down currents.

The pump circuitry includes a common mode feedback circuit used to maintain a proper output common mode. That is, the output signals provide a differential signal that changes about a common mode voltage level. In some applications, it is desired to maintain this level in the mid-range of the voltage supply (~Vdd/2).

The common mode feedback circuit includes transistors M5 to M9. During operation of the pull-down transistors (M1–M4), P-channel transistors M5 and M6 steer current to n-channel transistor M9 in response to transistors M1–M4 and any output loading. The current conducted through M9 is used to establish gate voltages for n-channel transistors M7 and M8. The size of the transistors is chosen to establish a predetermined common mode level. If the common mode of the output signals changes, the common mode feedback circuit compensates for the change. For example, if the common mode on the output nodes increases, transistors M7 and M8 will conduct more current to reduce the output node voltage. Likewise, transistors M7 and M8 will decrease current drain from the output nodes if the common mode level is reduced.

The circuit of FIG. 1 is not easily applied to low voltage circuits. That is, the gate-source voltage drops (Vgs) across M5 and M6 in series with M9 may be too great in a low voltage circuit. For example, if Vdd in FIG. 1 is 1.8 volts, the Vgs drop across transistors M5 and M6 is about a threshold voltage, Vt, plus a drain-source saturation voltage (Vsat). Similarly, M9 has a voltage drop of Vt+Vsat. If Vt is 0.5 volts and Vsat is 0.1 volts, the common mode will be about 1.2 volts. In a 1.8 volt system, the common mode is substantially greater than the desired 0.9 volt level.

For the reasons stated above, and for other reasons stated below which will become apparent to those skilled in the art upon reading and understanding the present specification, there is a need in the art for a differential charge pump circuit that can be implemented in a low voltage circuit.

SUMMARY OF THE INVENTION

The above-mentioned problems with charge pump circuitry and other problems are addressed by the present invention and will be understood by reading and studying the following specification.

In one embodiment, a charge pump circuit comprises a differential circuit having input connections to receive first and second complimentary input signal pairs, and first and second output connections provide first and second output signals in response to the first and second complimentary input signal pairs. A common mode feedback circuit is coupled to the output connections. The common mode feedback circuit comprises a first current path to conduct a first current in response to the first output signal, a second current path to conduct a second current in response to the second output signal, and a current mirror circuit coupled to the first and second current paths. The current mirror circuit is coupled to selectively control bias circuitry coupled to the first and second outputs.

In another embodiment, a charge pump circuit comprises a differential circuit comprising, a first pull-down transistor coupled to a first output node, a gate of the first pull-down transistor is coupled to receive a first input voltage signal, and a second pull-down transistor coupled to a second output node, a gate of the second pull-down transistor is coupled to receive a second input voltage signal. The differential circuit further comprises a third pull-down transistor coupled to the first output node, a gate of the third pull-down transistor is coupled to receive a third input voltage signal, and a fourth pull-down transistor coupled to the second output node, a gate of the fourth pull-down transistor is coupled to receive a fourth input voltage signal. A common mode feedback circuit is coupled to the first and second output nodes. The common mode feedback circuit comprises a first current path to conduct a first current (primary current) in response to a voltage on the first output node, the first current path comprising first and second series coupled transistors, a second current path to conduct a second current in response to a voltage on the second output node, the second current path comprising third and fourth series coupled transistors, a first current mirror circuit coupled to replicate the first current, and a second current mirror circuit coupled to replicate the second current (this current may be a multiple of the primary current). The first and second current mirror circuits control bias circuitry coupled to the first and second output nodes.

A differential charge pump circuit is provided, in one embodiment, that comprises first and second differential input connections to receive first and second differential input signal pairs, and first and second output connections to provide a differential output signal having a common mode voltage, wherein the differential charge pump circuit operates with a supply voltage that is less than 2.0 volts and maintains a common mode voltage that is less than 1.0 volts. In another embodiment, the supply voltage that is less than 2.5 volts and maintains a common mode voltage that is less than 1.25 volts.

In yet another embodiment, a phase locked loop circuit comprises a phase-frequency detector circuit, and a differential charge pump circuit coupled to an output of the phase-frequency detector circuit. The differential charge pump circuit has first and second output connections to provide a differential output signal having a common mode voltage, wherein the differential charge pump circuit operates with a supply voltage that is less than 2.0 volts and maintains a common mode voltage that is less than 1.0 volts. A voltage-controlled oscillator is coupled to the differential charge pump circuit to provide a feedback signal to the phase-frequency detector circuit. A loop filter is coupled to the charge pump and the voltage controlled oscillator.

A phase locked loop circuit is provided that comprises a phase-frequency detector circuit, and a differential charge pump circuit coupled to an output of the phase-frequency detector circuit. The differential charge pump circuit has first and second output connections to provide a differential output signal having a common mode voltage. A voltage-controlled oscillator is coupled to the differential charge pump circuit to provide a feedback signal to the phase-frequency detector circuit, and a loop filter is coupled to the charge pump and the voltage controlled oscillator. The differential charge pump circuit comprises a common mode feedback circuit coupled to the first and second output connections. The common mode feedback circuit comprises a first current path to conduct a first current in response to a voltage on the first output connection, a second current path to conduct a second current in response to a voltage on the second output connection, and a current mirror circuit coupled to the first and second current paths, the current mirror circuit is coupled to selectively activate bias circuitry coupled to the first and second outputs.

DETAILED DESCRIPTION OF THE INVENTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 2:
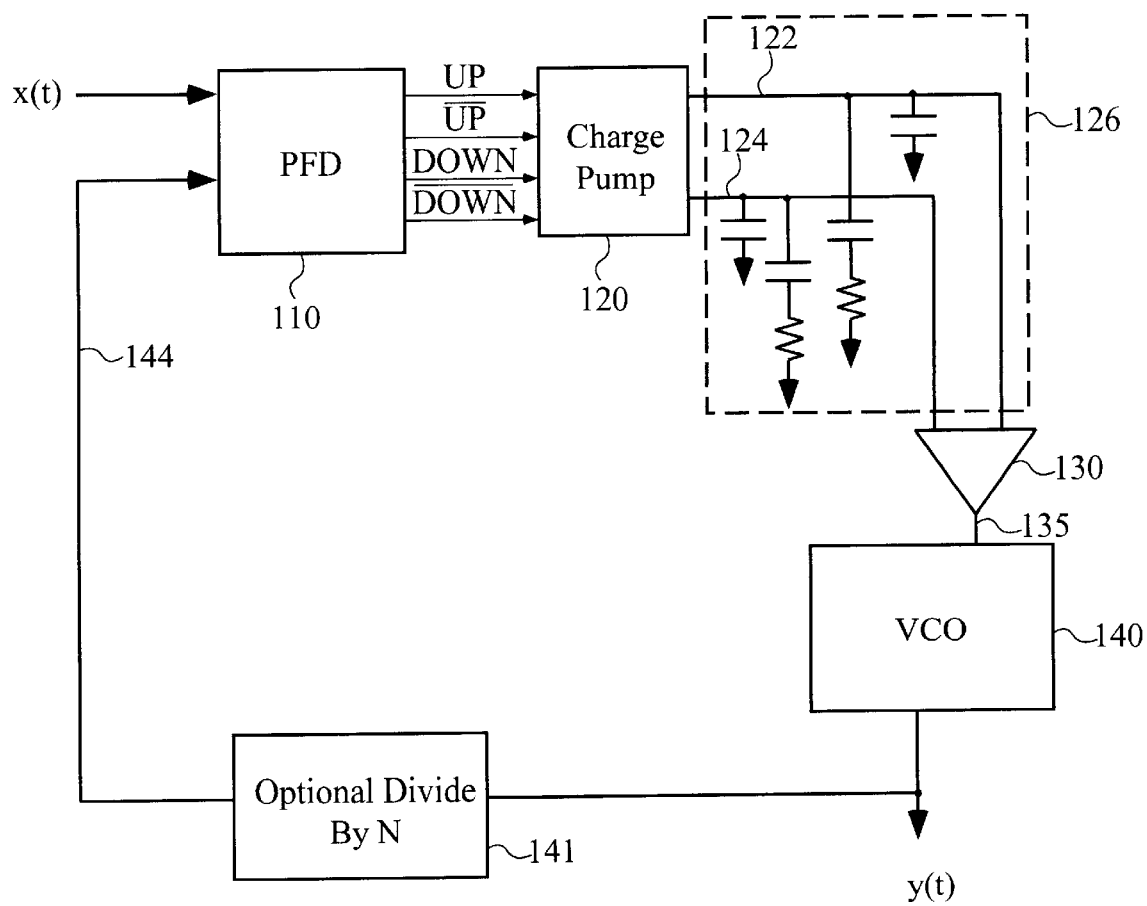
FIG. 2 illustrates a phase locked loop circuit having a charge pump of an embodiment of the present invention.

Referring to FIG. 2, a simplified phase locked loop (PLL) circuit 100 is illustrated. The PLL includes a phase-frequency detector (PFD) circuit 110 that determines a phase difference between an input signal, x(t) and a feedback signal 144. The PFD circuit outputs four control signals in one embodiment. The control signals are UP, /UP, DOWN and /DOWN, where the bar symbol, /, indicates an inverse signal. The PLL includes a charge pump circuit that provides a differential output signal on nodes 122 and 124 in response to the four control signals. The differential voltage is optionally converted to a single-ended voltage signal 135 by optional converter 130. The converter output signal is used to adjust an output y(t) of a voltage controlled oscillator (VCO) 140. In one embodiment, converter 130 is eliminated and signals on lines 122 and 124 are coupled to the VCO. The VCO output is fed back to the PFD and is adjusted to match the input signal x(t). An optional divider circuit 141 can be provided between the VCO and the PFD, as known to those skilled in the art. Likewise, a loop filter 126 is coupled to the outputs of the charge pump. One possible embodiment of a loop filter is illustrated in FIG. 2. Other loop filter embodiments can be implemented without departing from the present invention.

Figure 3:
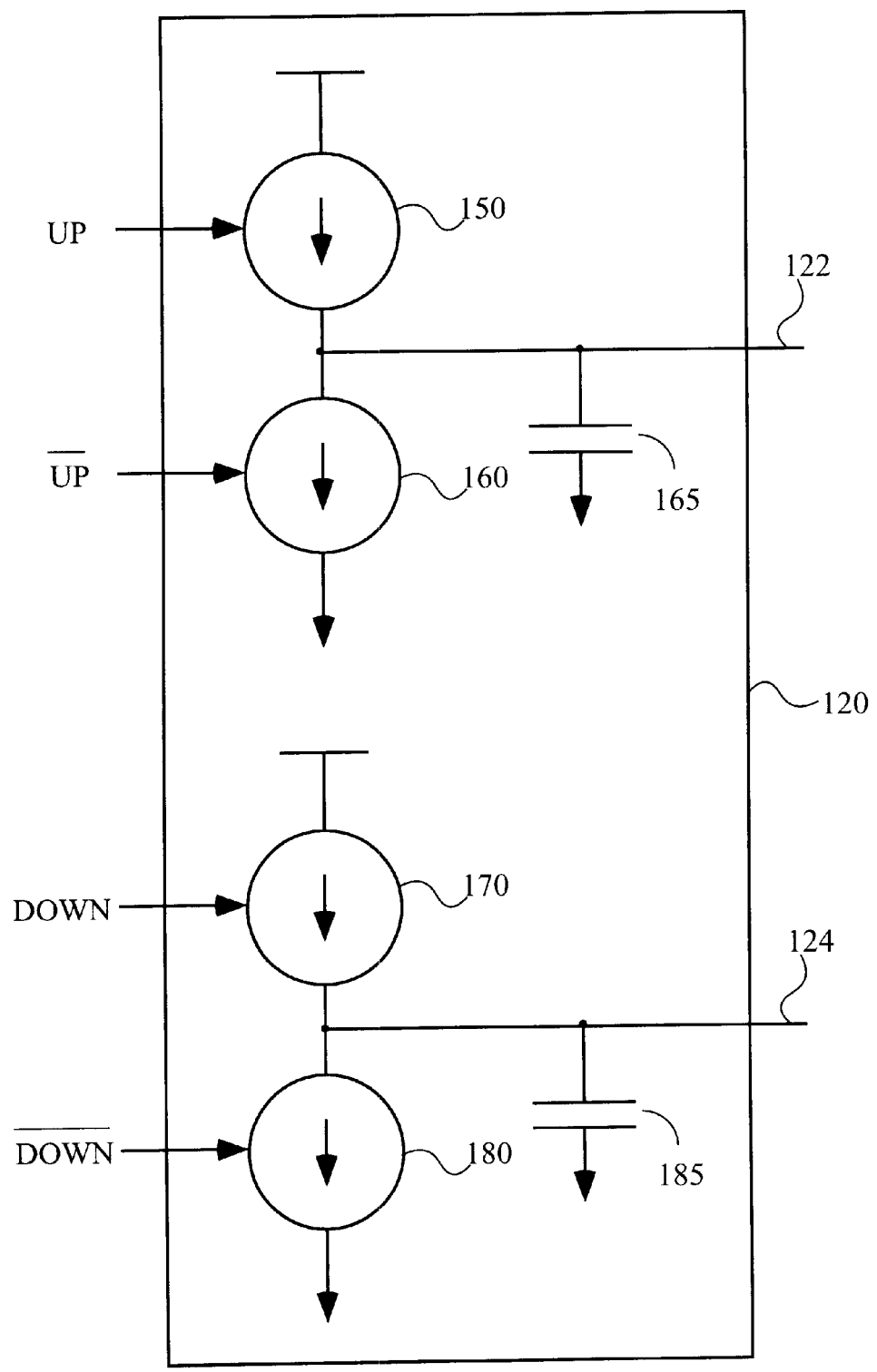
FIG. 3 illustrates the basic charge circuits of an embodiment of a charge pump of FIG. 2.

The charge pump circuit 120 is used to change the differential voltage signals on nodes 122 and 124. During operation the differential voltages will change, but should maintain a common mode voltage that is near the middle of the power supply range. By maintaining a mid-level common mode, the PLL has sufficient room to adjust the differential voltage signals. One simplified embodiment of a charging circuitry of a charge pump 120 is illustrated in FIG. 3. The charge pump includes first and second current sources 150 and 160. A capacitor 165 is coupled to the current sources and node 122. The capacitor stores a charge controlled by the current sources. During operation, current source 150 provides a charging current to the capacitor when the UP signal is active. The inverse signal, /UP, turns current source 160 off. The capacitor, therefore, increased its stored charge. When the UP signal is off, current source 160 reduces the charge on capacitor 165. Two current sources 170 and 180 are coupled to a second capacitor 185 at node 124. These current sources operate in the same manner. That is, when the DOWN signal is active, a charge on capacitor 185 is reduced through current source 180. When the DOWN signal is inactive, capacitor 185 is charged through current source 170.

Figure 1:
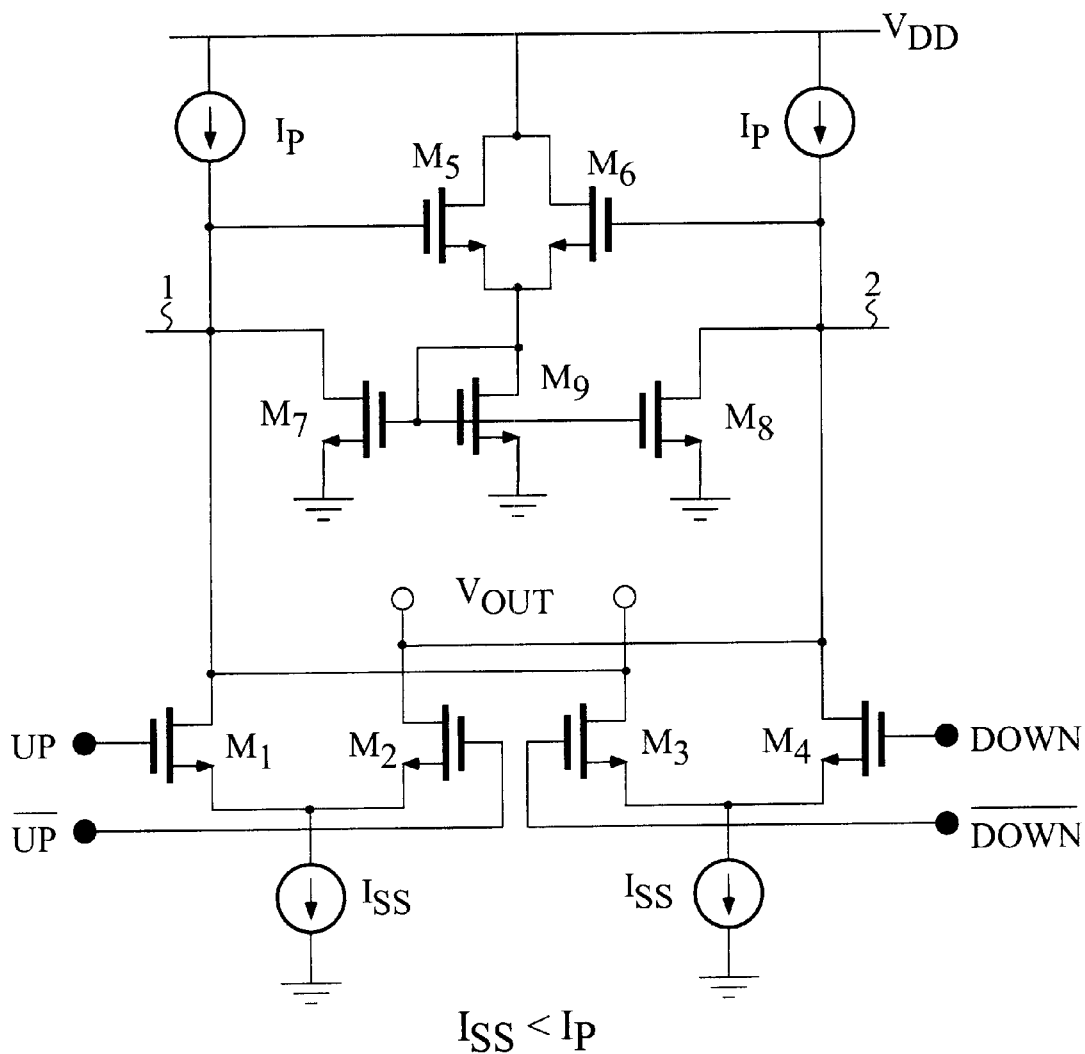
FIG. 1 is a schematic diagram of a prior art charge pump circuit.

As explained above, the charge pump of FIG. 1 cannot be implemented in a low voltage system because the common mode level would be too close to the supply voltage. A charge pump circuit of the present invention can be implemented in a low voltage system while maintaining a sufficient mid-level common mode voltage. For example, the present invention can be implemented in a 1.8 volt system and maintain a common mode that is about 0.9 volts.

Figure 4:
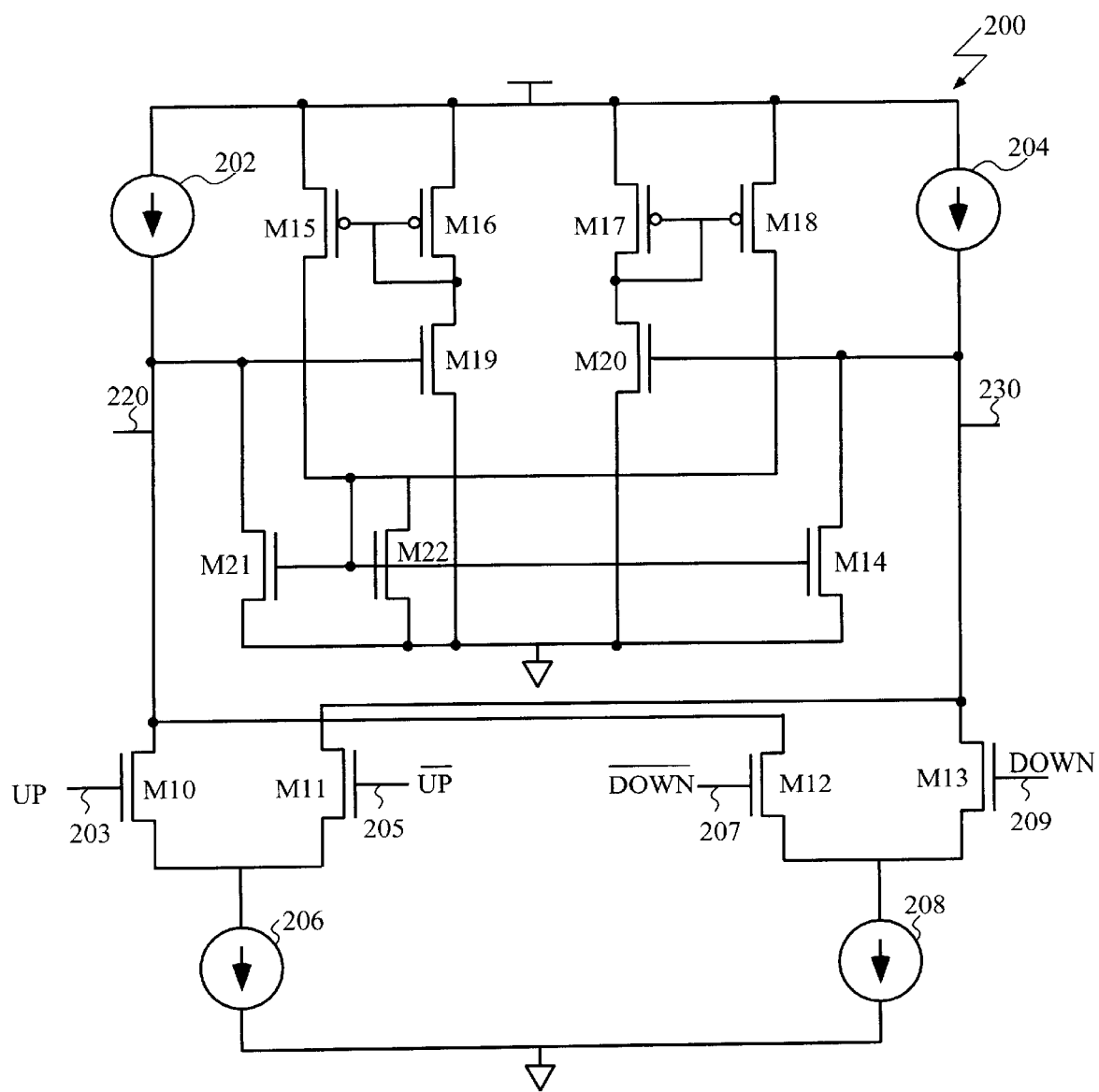
FIG. 4 is a schematic diagram of an embodiment of a charge pump of the present invention.

Referring to FIG. 4, a schematic diagram of a differential charge pump 200 of one embodiment of the present invention is described. The charge pump circuit includes a first pair of differential transistors M10 and M11 having gates coupled to receive first differential input voltages, UP and /UP. M10 is coupled between current source 202 and current source 206. M11, likewise, is coupled between current source 204 and current source 206. The charge pump circuit 200 includes a second pair of differential transistors M12 and M13 having gates coupled to receive second differential input voltages, DOWN and /DOWN. M12 is coupled between current source 202 and current source 206. Similarly, M13 is coupled between current source 204 and current source 206. Current sources 202 and 204 source current to the output nodes and current sources 206 and 208 sink current from the output nodes.

Charge pump 200 has three modes of operation. In a first mode, /UP and /DOWN are both high. As such, transistors M11 and M12 are active and current is conducted through both current sources 206 and 208. Current sources 202 and 204 are slightly larger (conduct more current) than sources 206 and 208. This difference allows for current consumption by the common mode feedback circuitry. During the first mode, voltages on both output nodes 220 and 230 are constant as $I_{202}$-$I_{208}$-Icm=0.

In a second mode, UP and /DOWN are high to activate transistors M10 and M12. Transistors M11 and M13 are turned off. As such, output node 220 is pulled low through both current sources 206 and 208. Output node 230, in contrast, is pulled high through current source 204.

In a third mode, /UP and DOWN are high to activate transistors M11 and M13. Transistors M10 and M12 are turned off. As such, output node 230 is pulled low through both current sources 206 and 208. Output node 220, in contrast, is pulled high through current source 202.

Charge pump circuit 200 includes a common mode feedback circuit that is provided to maintain a common mode voltage on nodes 220 and 230. The common mode feedback circuit includes n-channel pull-down transistors M14 and M21 respectively coupled to output nodes 230 and 220. These transistors are used to maintain the output common mode voltage. The circuitry for providing gate voltages for transistors M14 and M21 is explained below.

Series coupled transistors M16 and M19 provide a first current path that is controlled by a voltage on output node 220. Similarly, series coupled transistors M17 and M20 provide a second current path that is controlled by a voltage on output node 230. The current conducted through the first current path (M16, M19) is mirrored to transistor M15, and the current through the second current path (M17, M20) is mirrored to transistor M18. Transistors M15 and M18 are each coupled in series with transistor M22. The gate of transistor M22 is also coupled to transistors M14 and M21. M22 also has its gate coupled to M15 and M18. As such, the combined current through M15 and M18 is conducted through transistor M22 and establishes a gate voltage for transistor M22.

During operation, the sum current conducted through M19 and M20 remains constant if the common mode voltage is maintained. If the common mode voltage increases, the sum current increases. The current conducted through transistor M22 is therefore increased. The resultant increase in the gate voltage of M22 increases the current through both M21 and M14 to reduce the common mode voltage. In a similar manner, if the common mode voltage decreases, the sum current through M19 and M20 decreases. The current conducted through transistor M22 is therefore decreased. The decrease in the gate voltage of M22 decreases the current through both M21 and M14 to increase the common mode voltage.

The present charge pump circuit can be operated in a low voltage system, such as a 1.8 volt circuit. The voltage drop across transistor M22 is about a Vt plus an n-channel drain-source saturation voltage (Vsat). The voltage across transistors M15 and M18 is only a p-channel drain-source saturation voltage (Vsat). Assuming a Vt of 0.5 volt, an n-channel Vsat of 0.1 volt and a p-channel Vsat of 0.2 volts, the common mode voltage level is about 0.7 volts. In one embodiment, the charge pump can operate with a supply voltage that is less than 2.0 volts and maintain a common mode voltage that is less than 1.0 volts. In another embodiment, the charge pump operates with a supply voltage that is about 2.5 volts and maintains a common mode voltage that is less than about 1.25 volts.

Conclusion

A charge pump circuit has been described that can be used in a phase-locked loop circuit. The charge pump provides a differential output signal that has a common mode voltage. The charge pump includes a common mode feedback circuit that maintains a predetermined common mode voltage on the output connections of the charge pump. The charge pump can operate with a small supply voltage. In one embodiment, the charge pump can operate with a supply voltage that is less than 2.0 volts and maintain a common mode voltage that is less than 1.0 volts. The common mode feedback circuit includes current mirror circuitry and bias circuitry. The current mirror circuitry and the bias circuitry adjust the common mode voltage in response to input signals.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A phase locked loop circuit comprising:
    a phase-frequency detector circuit;
    a differential charge pump circuit coupled to an output of the phase-frequency detector circuit, the differential charge pump circuit has first and second output connections to provide a differential output signal having a common mode voltage, wherein the differential charge pump circuit operates with a supply voltage that is less than 2.0 volts and maintains a common mode voltage that is less than 1.0 volts;
    a voltage controlled oscillator coupled to the differential charge pump circuit to provide a feedback signal to the phase-frequency detector circuit; and
    a loop filter coupled to the charge pump and the voltage controlled oscillator;
    wherein the differential charge pump circuit comprises:
        a common mode feedback circuit coupled to the first and second output connections, the common mode feedback circuit comprises,
        a first current path to conduct a first current in response to a voltage on the first output connection,
        a second current path to conduct a second current in response to a voltage on the second output connection, and
        a first and a second current mirror circuit coupled to the first and second current paths, respectively, the first and the second current mirror circuits are coupled to selectively activate bias circuitry coupled to the first and second outputs.

2. The phase locked loop circuit of claim 1 wherein the first current path comprises series coupled first and second transistors, and the second current path comprises series coupled third and fourth transistors.

3. The phase locked loop circuit of claim 1 wherein the bias circuitry comprises:
    a first bias transistor having a gate and drain coupled to the first and the second current mirror circuits;
    a second bias transistor coupled to a first output connection, the second bias transistor has a gate coupled to the gate of the first bias transistor; and
    a third bias transistor coupled to a second output connection, the third bias transistor has a gate coupled to the gate of the first bias transistor.

4. The phase locked loop circuit of claim 1 wherein the differential charge pump circuit comprises:
    a first current path to conduct a first current in response to a voltage on the first output connection, the first current path comprising a first n-channel transistor coupled in series with a first p-channel transistor;
    a second current path to conduct a second current in response to a voltage on the second output connection, the second current path comprising a second n-channel transistor coupled in series with a second p-channel transistor;
    a first current mirror circuit coupled to replicate the first current, and a second current mirror circuit coupled to replicate the second current;

a first n-channel bias transistor having a gate and drain coupled to the first and second current mirror circuits;

a second n-channel bias transistor coupled to the first output connection, the second n-channel bias transistor has a gate coupled to the gate of the first channel bias transistor; and a third n-channel bias transistor coupled to the second output connection, the third n-channel bias transistor has a gate coupled to the gate of the first n-channel bias transistor.

5. A phase locked loop circuit comprising:

a phase-frequency detector circuit;

a differential charge pump circuit coupled to an output of the phase-frequency detector circuit, the differential charge pump circuit has first and second output connections to provide a differential output signal having a common mode voltage;

a voltage controlled oscillator coupled to the differential charge pump circuit to provide a feedback signal to the phase-frequency detector circuit; and a loop filter coupled to the charge pump and the voltage controlled oscillator;

wherein the differential charge pump circuit comprises:

a common mode feedback circuit coupled to the first an second output connections, the common mode feedback circuit comprises, a first current path to conduct a first current in response to a voltage on the first output connection, a second current path to conduct a second current in response to a voltage on the second output connection, and a first and a second current mirror circuit coupled to the first and second current paths, respectively, the first and the second current mirror circuits are coupled to selectively activate bias circuitry coupled to the first and second outputs.

6. The phase locked loop circuit of claim 5 wherein the bias circuitry comprises:

a first bias transistor having a gate and drain coupled to the first and the second current mirror circuits;

a second bias transistor coupled to a first output connection, the second bias transistor has a gate coupled to the gate of the first bias transistor; and a third bias transistor coupled to a second output connection, the third bias transistor has a gate coupled to the gate of the first bias transistor.

7. A phase locked loop circuit comprising:

a phase-frequency detector circuit;

a differential charge pump circuit coupled to an output of the phase-frequency detector circuit, the differential charge pump circuit has first and second output connections to provide a differential output signal having a common mode voltage;

a voltage controlled oscillator coupled to the differential charge pump circuit to provide a feedback signal to the phase-frequency detector circuit; and a loop filter coupled to the charge pump and the voltage controlled oscillator wherein the differential charge pump circuit comprises:

a first current path to conduct a first current in response to a voltage on the first output connection, the first current path comprising a first n-channel transistor coupled in series with a first p-channel transistor;

a second current path to conduct a second current in response to a voltage on the second output connection, the second current path comprising a second n-channel transistor coupled in series with a second p-channel transistor;

a first current mirror circuit coupled to replicate the first current, and a second current mirror circuit coupled to replicate the second current;

a first n-channel bias transistor having a gate and drain coupled to the first and second current mirror circuits;

a second n-channel bias transistor coupled to the first output connection, the second n-channel bias transistor has a gate coupled to the gate of the first channel bias transistor; and a third n-channel bias transistor coupled to the second output connection, the third n-channel bias transistor has a gate coupled to the gate of the first n-channel bias transistor.

* * * * *